United States Patent [19]

Iliou et al.

[11] Patent Number: 4,616,413

[45] Date of Patent: Oct. 14, 1986

[54] PROCESS FOR MANUFACTURING PRINTED CIRCUITS WITH AN INDIVIDUAL RIGID CONDUCTIVE METALLIC SUPPORT

[75] Inventors: Louis Iliou; Bruno Gotkovsky, both of Paris, France

[73] Assignee: Thomson-CSF, Paris, France

[21] Appl. No.: 754,184

[22] Filed: Jul. 9, 1985

Related U.S. Application Data

[63] Continuation of Ser. No. 477,521, Mar. 21, 1983, abandoned.

[30] Foreign Application Priority Data

Mar. 23, 1982 [FR] France .................................. 82 04916

[51] Int. Cl.[4] .............................................. H05K 3/30
[52] U.S. Cl. .................................... 29/832; 156/307.3; 174/68.5; 333/204
[58] Field of Search ........................ 29/832; 156/307.3; 174/68.5; 333/204

[56] References Cited

U.S. PATENT DOCUMENTS

| | | | |
|---|---|---|---|
| 2,955,974 | 10/1960 | Allen et al. | 156/307.3 X |
| 3,433,888 | 3/1969 | Tally et al. | 174/68.5 |
| 3,795,047 | 3/1974 | Abolafia et al. | 29/830 X |
| 3,955,068 | 5/1976 | Shaheen . | |
| 4,242,157 | 12/1980 | Gehle | 29/589 X |
| 4,288,530 | 9/1981 | Bedard et al. . | |
| 4,329,779 | 5/1982 | England | 29/832 X |
| 4,335,180 | 6/1982 | Traut | 174/68.5 |

FOREIGN PATENT DOCUMENTS

1403061 5/1965 France .
2137001 12/1972 France .

Primary Examiner—Mark Rosenbaum
Assistant Examiner—Carl J. Arbes
Attorney, Agent, or Firm—Cushman, Darby & Cushman

[57] ABSTRACT

A process for manufacturing a printed circuit having a conductive rigid metallic support that is well suited for UHF use. A circuit is engraved on one of two metallized surfaces of a substrate plate. After the circuit is formed, an epoxide adhesive film is used to secure the non-engraved surface to the conductive rigid metallic support. The resulting assembly is then machined.

7 Claims, 3 Drawing Figures

PROCESS FOR MANUFACTURING PRINTED CIRCUITS WITH AN INDIVIDUAL RIGID CONDUCTIVE METALLIC SUPPORT

This is a continuation of application Ser. No. 477,521, filed Mar. 21, 1983, which was abandoned upon the filing hereof.

BACKGROUND OF THE INVENTION

1. Field of the Invention

The present invention concerns a process for manufacturing printed circuits with an individual conductor rigid metallic support.

2. Description of the Prior Art

When it is desired to obtain, especially in a device functioning in microwaves a printed circuit of which at least one part of the printed conductors presents a precisely determined impedance with respect to a determined potential, especially a ground plane that is generally the chassis or the housing of this device, this printed circuit is formed on a ceramic substrate that is then attached to the chassis and/or inserted into the housing. Such a process generally achieves good results, but this printed circuit is not dismountable and cannot be removed from the chassis or housing without damage, which can constitute a considerable drawback in certain cases, for example at the moment of adjusting the equipments. Furthermore, it has been proposed to stick engraved and machined plates of printed circuits on rigid supports, using a glue loaded with conductive particles for the use in UHF, but the excess of glue provoked during the step of sticking under pressure obstructs the bore-holes of the plates and cannot be completely eliminated, thus causing unacceptable operational defects at UHF.

SUMMARY OF THE INVENTION

One object of the invention is to provide a process for manufacturing printed circuits of which at least one part of the printed conductors present determined electric characteristics with respect to the chassis or the housing of the device of which they form a part, these printed circuits being easily removable.

Another object of the invention is a process of the type mentioned herein-above allowing to rigidify a flexible insulating support for the printed circuit, this circuit able to be, when necessary, easily fixed onto a chassis or housing, and easily removed if necessary.

The process according to the present invention includes engraving, in a classic manner, the printed circuit on a plate of insulating substrate, advantageously flexible, metallized or covered by metallic sheets on the two faces, at least the metallic covering of the face destined to be engraved being made of metal capable of being engraved; in cutting a rigid support plate having dimensions at least equal to those of the said substrate sheet; in sticking, preferably with the use of an electrically conductive adhesive film, the substrate sheet on the rigid plate of the support; then machining the assembly of the two stuck plates.

DESCRIPTION OF THE INVENTION

Figure 1:
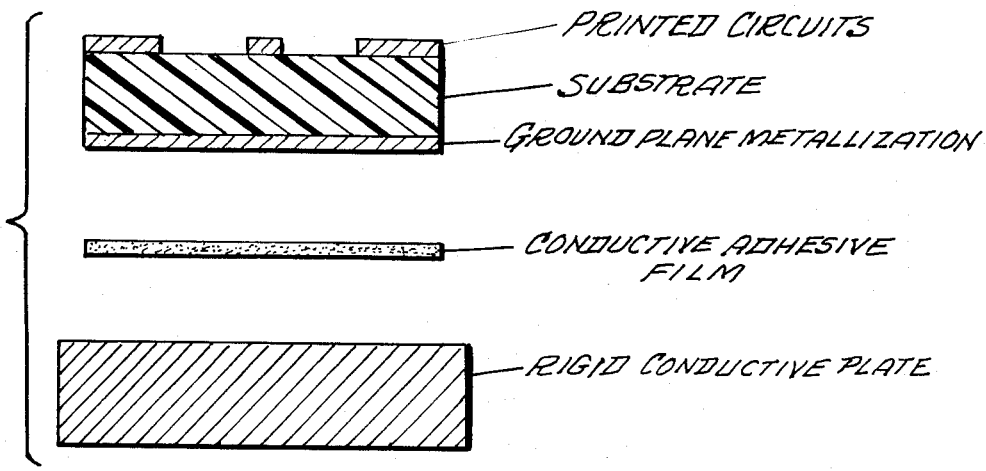
FIG. 1 is a view of an MIC about to be assembled according to the present invention (shown before sticking)
Figure 2:
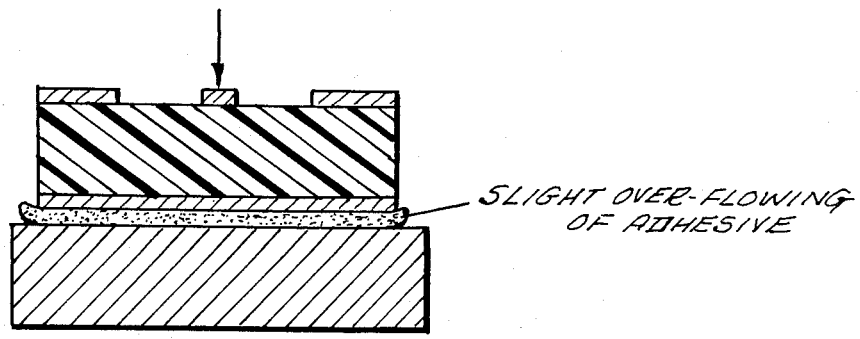
FIG. 2 is a view of the MIC after sticking and hardening in an oven according to the invention.
Figure 3:
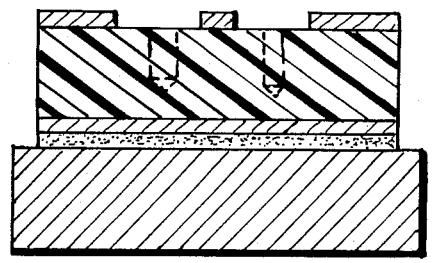
FIG. 3 is a view of the MIC after sticking and machining according to the invention.

The process of the invention will be better understood with the use of the detailed description of a nonlimitative example of operation described herein-below.

The process described herein-below in detail describes the manufacture of a printed circuit intended to function at UHF and in which certain printed conductor must form capacitive circuits with respect to a ground plane onto which must be fixed this printed circuit. With this purpose, is selected for the printed circuit a substrate presenting an appropriate dielectric constant and cut out into the desired dimensions. Generally, when the capacity presented by the said capacitive circuits must be relatively high, a substrate having a dielectric constant as high as possible is selected, provided that it is pratically homogeneous and constant, in order that the conductors of the printed circuit forming the capacitive circuits do not have too large dimensions.

In the present example of operation, this substrate is a flexible substrate, preferably made of loaded ceramic "Teflon" having a dielectric constant of about 10 to 12 and presenting, furthermore, the advantage of being easy to cut out and machine. Such product is, for example, commercialized under the names "Epsilame 10" or "Duroid 6010" or "Diclad 810". These products are copper plated on two faces. At the moment of chemical engraving of the printed circuit, one of the two faces is appropriately protected and engraving is performed on the other face. Preferably, for the use at UHF, a layer of good-electricity conducting metal, such as gold, is deposited on the conductors of the printed circuit in order to avoid the drawbacks of the skin effect. It is, however, well understood that the process of the invention is not limited to the manufacture of circuits operating in UHF, but also applies to printed circuits operating at lower frequencies.

Furthermore, the rigid metallic plate is prepared that must support the flexible plate of the printed circuit. In the present example, this rigid plate is of aluminium, and its dimensions are advantageously larger than those of the printed circuit: thus there is no need to effect a very accurate positioning of the flexible plate with respect to the rigid plate, and the excess glue produced during the subsequent stage of subjecting it to pressure does not risk overflowing on to the adjacent equipment. If necessary, it is possible to apply an anti-corrosion treatment to the rigid plate. In the case where it is made of aluminium, it is possible to protect it chemically with a chromate coating.

Thereafter, the faces to be stuck of the rigid plate and the flexible plate are rubbed down, scoured and dried, and these plates are degassed in an oven heated at for example about 80° C. for one hour.

The two plates are thus ready to be stuck together. Preferably, the gluing material used is an electrically conductive epoxide adhesive film, such as the film "Ablefilm ECF 550". This film is cut out to the dimensions of the flexible plate, while preventing any contamination during its handling. Once the rigid plate and the flexible plate for the printed circuit have been removed from the oven, the cut-out adhesive film is rapidly positioned between the faces to be stuck of these two plates, and immediately a pressure is applied to the assembly of the two plates and the adhesive film disposed between them.

This pressure can, for example, be applied by using pressure rollers, between which the assembly passes through. The pressure can be in the range of several kgf/cm$^2$. The adhesive film, which becomes sticky due to the heat transmitted to it by the two plates (after their removal from the degassing oven, the two plates are handled as quickly as possible in order to remain sufficiently hot at the moment when the pressure is applied) adheres to the two plates. The said pressure is selected so that it is sufficiently high to encourage good sticking, but not too high to prevent excessive over-flowing of the adhesive film.

The sticking is completed by placing the said assembly in an oven, to harden, and subjecting it to constant pressure, in the range of 1 kgf/cm$^2$. In the case where the said film "Ablefilm ECF 550" is used, this hardening stage is, preferably, carried out at 120° C. during about 4 hours.

Finally, the printed circuit and its support are machined in order to obtain a rigid plate having correct dimensions and in order to produce, more especially, holes for the passage of fixation screws for the plates on the chassis or in a housing and, where necessary, holes for receiving the ends of the connecting wires of the components to be welded onto the printed circuit, these components being, of course, disposed on the "copper" side of the printed circuit. If these connecting wires must not be connected to the ground, or at least to the rigid support plate, evidently steps are taken to insulate the ends of these wires with respect to the rigid plate, for example by providing blind holes into the substrate of the printed circuit.

Due to the process of the present invention, easily removable printed circuits are obtained, the rigid support of which can be connected to the ground or to a determined potential. Through the suitable choice of metal of the plate of the rigid support, it is possible to practically eliminate the thermal restriction effects exercised on this support by the chassis or the housing on which it can have a high dietectric constant, thus allowing the dimensions of these circuits to be reduced.

We claim:

1. A process for manufacturing a microwave integrated circuit (MIC) having its own rigid ground plane, said MIC being of the type wherein certain printed conductors form capacitive circuits with respect to said ground plane, comprising the steps of:
    providing a substrate that is metallized on its two faces;
    engraving a circuit on one of said two faces;
    providing a rigid metallic support plate having dimensions at least as large as those of said substrate;
    gluing, using an electrically conductive epoxide thermofusible adhesive film, the non-engraved face of said substrate to a surface of said support plate, the rigid plate and engraved substrate together forming a printed circuit assembly;
    machining the printed circuit assemble; and
    coupling additional components to said assembly to form said MIC.

2. A process according to claim 1 wherein the step of providing a substrate comprises the step of providing a flexible material substrate metallized on its two faces with copper foil.

3. A process according to claim 2 wherein the step of providing a substrate comprises the step of providing a ceramic loaded Teflon substrate.

4. A process according to claim 1 wherein the step of gluing comprises the step of gluing with a thermofusible film.

5. A process according to claim 3 wherein the step of gluing comprises the step of gluing with a thermofusible film.

6. A process according to claim 4 wherein the step of gluing with an adhesive film comprises the step of gluing with Ablefilm ECF 550.

7. A process according to claim 6 wherein the step of gluing comprises the steps of:
    heating the substrate and the support plate in a degassing oven to a temperature of substantially 80° C.;
    positioning the adhesive film between the surfaces to be joined;
    applying pressure of substantially several kgf/cm$^2$ to the substrate and support plate forcing them together; and
    maintaining the stuck assembly at a temperature of substantially 120° C. for about four (4) hours at a pressure of substantially 1 kgf/cm$^2$.

* * * * *